(12) United States Patent
Tsai et al.

(10) Patent No.: US 6,440,863 B1
(45) Date of Patent: Aug. 27, 2002

(54) PLASMA ETCH METHOD FOR FORMING PATTERNED OXYGEN CONTAINING PLASMA ETCHABLE LAYER

(75) Inventors: Chia-Shiun Tsai, Hsin-chu; Chao-Cheng Chen, Tainan; Hun-Jan Tao, Hsin-chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 253 days.

(21) Appl. No.: 09/148,556

(22) Filed: Sep. 4, 1998

(51) Int. Cl.[7] ............................................. H01L 21/302
(52) U.S. Cl. .................... 438/710; 438/711; 438/717; 438/723
(58) Field of Search ................... 438/711, 618, 438/673, 710, 717, 725, 723, 733; 257/774

(56) References Cited

U.S. PATENT DOCUMENTS

| | | | |
|---|---|---|---|
| 4,786,360 A | * 11/1988 | Cote et al. | 438/673 |
| 5,514,247 A | * 5/1996 | Shan et al. | 156/643.1 |
| 5,559,055 A | * 9/1996 | Chang et al. | 437/195 |
| 5,565,384 A | * 10/1996 | Havemann | 437/228 |
| 5,614,765 A | * 3/1997 | Avanzino et al. | 257/774 |
| 5,635,423 A | * 6/1997 | Huang et al. | 437/195 |
| 5,686,354 A | * 11/1997 | Avanzino et al. | 437/190 |
| 5,691,238 A | * 11/1997 | Avanzino et al. | 438/618 |
| 5,726,100 A | * 3/1998 | Givens | 438/702 |
| 5,759,921 A | * 6/1998 | Rostoker | 438/711 |

OTHER PUBLICATIONS

Chang et al, "VLSI Technology", The McGraw–Hill Companies 1996, pp. 346–355.*

* cited by examiner

Primary Examiner—Benjamin L. Utech
Assistant Examiner—Binh X. Tran
(74) Attorney, Agent, or Firm—George O. Saile; Stephen B. Ackerman

(57) ABSTRACT

A method for forming a patterned oxygen containing plasma etchable layer. There is first provided a substrate. There is then formed upon the substrate a blanket oxygen containing plasma etchable layer. There is then formed upon the blanket oxygen containing plasma etchable layer a blanket hard mask layer. There is then formed upon the blanket hard mask layer a patterned photoresist layer. There is then etched while employing a first plasma etch method in conjunction with the patterned photoresist layer as a first etch mask layer the blanket hard mask layer to form a patterned hard mask layer. There is then etched while employing a second plasma etch method in conjunction with at least the patterned hard mask layer as a second etch mask layer the blanket oxygen containing plasma etchable layer to form a patterned oxygen containing plasma etchable layer. The second plasma etch method employs a second etchant gas composition comprising: (1) an oxygen containing etchant gas which upon plasma activation provides an active oxygen etching species; and (2) boron trichloride.

15 Claims, 4 Drawing Sheets

PLASMA ETCH METHOD FOR FORMING PATTERNED OXYGEN CONTAINING PLASMA ETCHABLE LAYER

BACKGROUND OF THE INVENTION

1. Field of the Invention

The present invention relates generally to plasma etch methods for forming patterned layers within microelectronics fabrications. More particularly, the present invention relates t0 plasma etch methods for forming patterned oxygen containing plasma etchable layers within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and microelectronics device and patterned conductor layer dimensions have decreased, it has become increasingly common within the art of microelectronics fabrication to employ interposed between the patterns of narrow linewidth dimension and/or narrow pitch dimension patterned microelectronics conductor interconnect layers within microelectronics fabrications microelectronics dielectric layers formed of low dielectric constant dielectric materials. Such patterned microelectronics conductor interconnect layers often access within the microelectronics fabrications within which they are formed patterned conductor contact stud layers or patterned conductor interconnect stud layers. For the purposes of the present disclosure, low dielectric constant dielectric materials are intended as dielectric materials having a dielectric constant of less than about 3.0. For comparison purposes, dielectric layers formed employing conventional silicon oxide dielectric materials, silicon nitride dielectric materials or silicon oxynitride dielectric materials typically have dielectric constants in the range of from about 4.0 to about 7.0.

Microelectronics dielectric layers formed of low dielectric constant dielectric materials are desirable interposed between the patterns of narrow linewidth dimension and/or narrow pitch dimension patterned microelectronics conductor layers within microelectronics fabrications since such dielectric layers formed from such low dielectric constant dielectric materials provide dielectric layers which assist in providing microelectronics fabrications exhibiting enhanced microelectronics fabrication speed, attenuated patterned microelectronics conductor layer parasitic capacitance, and attenuated patterned microelectronics conductor layer cross-talk.

Low dielectric constant dielectric materials which may be employed for forming low dielectric constant microelectronics dielectric layers within microelectronics fabrications are typically materials with hydrogen and/or carbon content, such as but not limited to organic polymer spin-on-polymer dielectric materials (such as but not limited to polyimide organic polymer spin-on-polymer dielectric materials, fluorinated polyimide organic polymer spin-on-polymer dielectric materials, poly-arylene-ether organic polymer spin-on-polymer dielectric materials and fluorinated poly-arylene-ether organic polymer spin-on-polymer dielectric materials and fluorinated poly-arylene-ether organic polymer spin-on-polymer dielectric materials), amorphous carbon dielectric materials (such as but not limited to amorphous carbon and fluorinated amorphous carbon), and silsesgiuoxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials, and carbon bonded fluorocarbon silsesquioxane spin-on-glass (SOG) dielectric materials).

While organic polymer spin-on-polymer dielectric materials, amorphous carbon dielectric materials, and silsesquioxane spin-on-glass (SOG) dielectric materials are thus desirable within the art of microelectronics fabrication for forming low dielectric constant microelectronics dielectric layers interposed between the patterns of patterned conductor interconnect layers which access patterned conductor stud layers within microelectronics fabrications, such microelectronics fabrication structures are often not formed entirely without difficulty. In particular, when such structures are formed employing a damascene method which employs a patterning of a blanket oxygen containing plasma etchable low dielectric constant dielectric layer (such as formed employing an organic polymer spin-on-polymer dielectric material or an amorphous carbon dielectric material) to form a patterned oxygen containing plasma etchable low dielectric constant dielectric layer while employing a hard mask layer and an oxygen containing plasma to form a trench and/or via defined by the patterned oxygen containing plasma etchable low dielectric constant dielectric layer prior to forming a patterned conductor interconnect layer and/or patterned conductor stud layer within the trench and/or via while employing the damascene method, it is often difficult to control the linewidth and sidewall profile of the patterned oxygen containing plasma etchable low dielectric constant dielectric layer, and thus also the linewidth and sidewall profile of the trench and/or via. Trenches and/or vias formed with inadequately controlled linewidth and non-uniform sidewall profile are undesirable within microelectronics fabrications since patterned conductor interconnect layers and/or patterned conductor stud layers formed within those microelectronics fabrications are then also formed with inadequate linewidth control and non-uniform sidewall profiles.

It is thus towards the goal of forming within a microelectronics fabrication a patterned oxygen containing plasma etchable dielectric layer (preferably an oxygen containing plasma etchable low dielectric constant dielectric layer) within which is formed a trench and/or via which may be filled with a patterned conductor interconnect layer and/or a patterned conductor stud layer employing a damascene method, with enhanced linewidth control and uniform sidewall profile, that the present invention is more specifically directed. In a more general sense, the present invention is also directed towards a method for forming a patterned oxygen containing plasma etchable layer, which need not necessarily be a patterned oxygen containing plasma etchable dielectric layer, with enhanced linewidth control and uniform sidewall profile.

Various methods have been disclosed in the art of microelectronics fabrication for forming patterned microelectronics layers within microelectronics fabrications.

For example, Y. J. T. Lii in *ULSI Technology*, C. Y. Chang and S. M. Sze, eds., Mc-Graw Hill (New York: 1996), pp. 346–55 discloses various plasma process reactor configurations and plasma etchant gas compositions which may be employed when forming patterned layers within microelectronics fabrications while employing plasma etch methods.

In addition, Shan et al., in U.S. Pat. No. 5,514,247, discloses a method for forming within a microelectronics fabrication a via through a dielectric layer to access a conductor metal layer formed beneath the dielectric layer, without forming a sputtered conductor metal residue layer upon a sidewall of the via. The method employs within an etchant gas composition which is employed to etch the via through the dielectric layer a gas which reacts with the conductor metal to form a volatile and readily evacuable material.

Further, Chang et al., in U.S. Pat. No. 5,559,055 discloses a method for forming within a microelectronics fabrication, interposed between a series of patterns of a patterned conductor layer, an interlayer dielectric layer with decreased dielectric constant. The method employs a subtractive etching of an otherwise conventional patterned dielectric layer interposed between the patterns of the patterned conductor layer to form within the microelectronics fabrication a series of air filled voids interposed between patterns of the patterned conductor layer, where the series of air filled voids may subsequently be at least partially filled with a low dielectric constant dielectric material.

Still further, Havemann, in U.S. Pat. No. 5,565,384, discloses a method for forming within a microelectronics fabrication, with attenuated capacitance and attenuated via misalignment induced over-etching, a via accessing a patterned conductor layer within the microelectronics fabrication. The method employs an oxygen containing plasma etchable dielectric material interposed between the patterns of the patterned conductor layer, where the oxygen containing plasma etchable dielectric material serves as an etch stop layer when forming a via through a conventional fluorine containing plasma etchable dielectric layer formed over the oxygen containing plasma etchable dielectric material and the patterned conductor layer.

Finally, various dual damascene methods are disclosed for forming within microelectronics fabrications patterned dielectric layers interposed between the patterns of which may subsequently simultaneously be formed contiguous patterned conductor interconnect layers and patterned conductor stud layers. Specific methods are disclosed by: (1) Huang et al., in U.S. Pat. No. 5,635,423 (dual damascene method employing an etch stop layer interposed between a blanket first dielectric layer through which is formed a via into which is formed a conductor stud layer and a blanket second dielectric layer through which is formed a trench contiguous with the via, within which trench is formed a patterned conductor interconnect layer contiguous with the patterned conductor stud layer); (2) Avanzino et al., in U.S. Pat. No. 5,686,354 (dual damascene method employing a thin via mask formed within a trench formed partially through a dielectric layer, where the via mask is employed to form contiguous with the trench a via completely through the dielectric layer); and (3) Givens, in U.S. Pat. No. 5,726,100 (dual damascene method employing a single mask layer in conjunction with an etch stop layer interposed between a first dielectric layer and a second dielectric layer, where the single mask layer is employed for forming through the first dielectric layer a via contiguous with a trench formed through the second dielectric layer).

Desirable within the art of microelectronics fabrication are methods for forming patterned oxygen containing plasma etchable layers with enhanced linewidth control and uniform sidewall profile. More particularly desirable within the art of microelectronics fabrication are methods for forming patterned oxygen containing plasma etchable dielectric layers, such as oxygen containing plasma etchable low dielectric constant dielectric layers, with enhanced linewidth control and uniform sidewall profile.

It is towards the foregoing objects that the present invention is both generally and more specifically directed.

SUMMARY OF THE INVENTION

A first object of the present invention is to provide a method for forming within a microelectronics fabrication a patterned oxygen containing plasma etchable layer.

A second object of the present invention is to provide a method for forming a patterned oxygen containing plasma etchable layer in accord with the first object of the present invention, where the patterned oxygen containing plasma etchable layer is formed with enhanced linewidth control and uniform sidewall profile.

A third object of the present invention is to provide a method in accord with the first object of the present invention or the second object of the present invention, where the microelectronics fabrication is a semiconductor integrated circuit microelectronics fabrication and the patterned oxygen containing plasma etchable layer is a patterned oxygen containing plasma etchable low dielectric constant dielectric layer.

A fourth object of the present invention is to provide a method in accord with the first object of the present invention, the second object of the present invention or the third object of the present invention, which method is readily commercially implemented.

In accord with the objects of the present invention, there is provided by the present invention a method for forming a patterned oxygen containing plasma etchable layer within a microelectronics fabrication. To practice the method of the present invention, there is first provided a substrate. There is then formed over the substrate a blanket oxygen containing plasma etchable layer. There is then formed upon the blanket oxygen containing plasma etchable layer a blanket hard mask layer. There is then formed upon the blanket hard mask layer a patterned photoresist layer. There is then etched while employing a first plasma etch method in conjunction with the patterned photoresist layer as a first etch mask layer the blanket hard mask layer to form a patterned hard mask layer. There is then etched while employing a second plasma etch method in conjunction with at least the patterned hard mask layer as a second etch mask layer the blanket oxygen containing plasma etchable layer to form a patterned oxygen containing plasma etchable layer, where the second plasma etch method employs a second etchant gas composition comprising: (1) an oxygen containing etchant gas which upon plasma activation provides an active oxygen containing etching species; and (2) boron trichloride.

There is provided by the present invention a method for forming within a microelectronics fabrication a patterned oxygen containing plasma etchable layer, where the patterned oxygen containing plasma etchable layer is formed with enhanced linewidth control and uniform sidewall profile. The method of the present invention realizes the foregoing objects by employing when forming the patterned oxygen containing plasma etchable layer from a corresponding blanket oxygen containing plasma etchable layer a second plasma etch method employing a second etchant gas composition comprising: (1) an oxygen containing etchant gas which upon plasma activation provides an active oxygen containing etching species; and (2) boron trichloride. While the mechanism through which the method of the present invention realizes the foregoing objects of the present invention is not entirely clear, it is believed that incorporation of boron trichloride in conjunction with the oxygen containing etchant gas provides better linewidth control and a more uniform sidewall profile of the patterned oxygen containing plasma etchable layer, as well as an attenuated surface etching of the patterned hard mask layer employed in forming the patterned oxygen containing plasma etchable layer.

The present invention may be employed where the microelectronics fabrication is a semiconductor integrated circuit microelectronics fabrication and where the patterned oxygen containing plasma etchable layer is a patterned oxygen containing plasma etchable low dielectric constant dielectric layer. The present invention does not discriminate with respect to the nature of a microelectronics fabrication within which is formed a patterned oxygen containing plasma etchable layer in accord with the method of the present invention, nor does the present invention discriminate with respect to the nature of an oxygen containing plasma etchable material from which is formed the oxygen containing plasma etchable layer. Thus, although the method of the present invention provides utility in forming patterned oxygen containing plasma etchable low dielectric constant dielectric layers within semiconductor integrated circuit microelectronics fabrications, the method of the present invention may also be employed in forming patterned oxygen containing plasma etchable layers other than oxygen containing plasma etchable low dielectric constant dielectric layers within microelectronics fabrications including but not limited to semiconductor integrated circuit microelectronics fabrications, solar cell microelectronics fabrications, ceramic substrate microelectronics fabrications and flat panel display microelectronics fabrications.

The present invention is readily commercially implemented. The present invention employs methods and materials which are otherwise generally known in the art of microelectronics fabrication. Since it is a novel ordering and use of methods and materials which provides the method of the present invention, rather than the existence of the methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming within a microelectronics fabrication a patterned oxygen containing plasma etchable layer with enhanced linewidth control and uniform sidewall profile. The method of the present invention provides the patterned oxygen containing plasma etchable layer with enhanced linewidth control and uniform sidewall profile by employing along with a patterned hard mask layer when forming the patterned oxygen containing plasma etchable layer a plasma etchant gas composition comprising: (1) an oxygen containing etchant gas which upon plasma activation provides an active oxygen containing etchant species; and (2) boron trichloride.

Although the method of the present invention provides particular value when forming patterned oxygen containing plasma etchable low dielectric constant layers within semiconductor integrated circuit microelectronics fabrications, the present invention may also be employed to form patterned oxygen containing plasma etchable layers other than oxygen containing plasma etchable low dielectric constant dielectric layers within microelectronics fabrications including but not limited to semiconductor integrated circuit microelectronics fabrications, solar cell microelectronics fabrications, ceramic substrate microelectronics fabrications and flat panel display microelectronics fabrications.

First Preferred Embodiment

Figure 1:
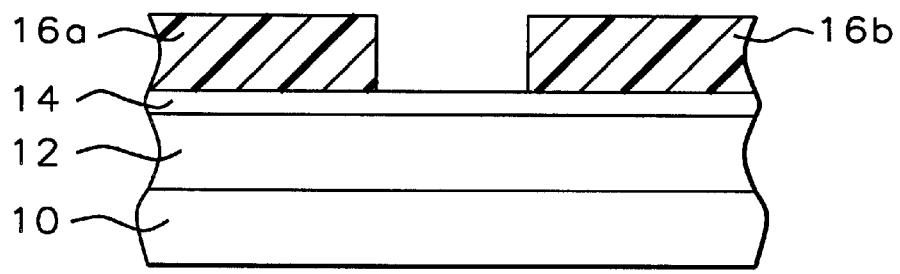
FIG. 1, FIG. 2 and FIG. 3 show a series of schematic cross-sectional diagrams illustrating the results of forming in accord with a general embodiment of the present invention which comprises a first preferred embodiment of the present invention a patterned oxygen containing plasma etchable layer within a microelectronics fabrication.
Figure 2:
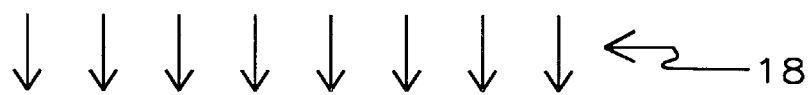
Figure 2:
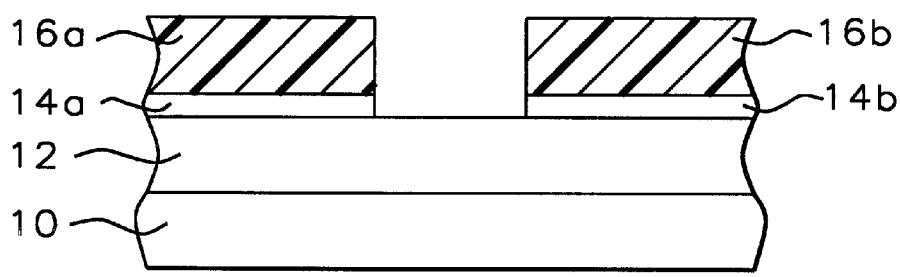
Figure 3:
Figure 3:
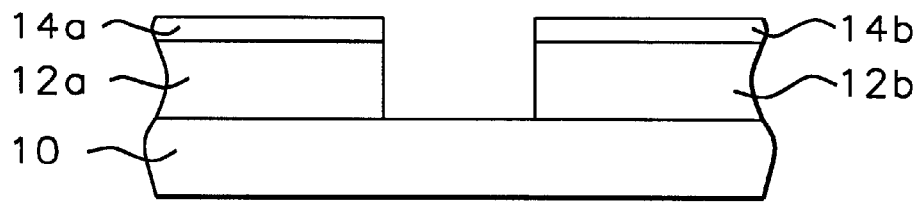

Referring now to FIG. 1 to FIG. 3, there is shown a series of schematic cross-sectional diagrams illustrating the results of forming within a microelectronics fabrication in accord with a general embodiment of the present invention which comprises a first preferred embodiment of the present invention a pair of patterned oxygen containing plasma etchable layers. Shown in FIG. 1 is a schematic cross-sectional diagram of the microelectronics fabrication at an early stage in its fabrication.

Shown in FIG. 1 is a substrate 10 employed within a microelectronics fabrication, where the substrate to has formed thereupon a blanket oxygen containing plasma etchable layer 12 which in turn has formed thereupon a blanket hard mask layer 14 which finally in turn has formed thereupon a pair of patterned photoresist layers 16a and 16b.

Within the first preferred embodiment of the present invention, the substrate 10 may be a substrate employed within a microelectronics fabrication including but not limited to a semiconductor integrated circuit microelectronics fabrication, a solar cell microelectronics fabrication, a ceramic substrate microelectronics fabrication or a flat panel display microelectronics fabrication. Although not specifically illustrated within the schematic cross-sectional diagram of FIG. 1, the substrate 10 may be the substrate itself employed within the microelectronics fabrication, or in the alternative, the substrate 10 may be the substrate employed within the microelectronics fabrication, where the substrate may have any of several additional microelectronics layers formed thereupon or thereover as are conventional within the microelectronics fabrication within which is employed the substrate. Such additional microelectronics layers may include, but are not limited to, microelectronics conductor layers, microelectronics semiconductor layers and microelectronics dielectric layers.

Within the first preferred embodiment of the present invention with respect to the blanket oxygen containing plasma etchable layer 12, the blanket oxygen containing plasma etchable layer 12 may be formed from any of several oxygen containing plasma etchable materials as are known in the art of microelectronics fabrication. Such oxygen containing plasma etchable materials may include, but are not limited to oxygen containing plasma etchable dielectric materials (such as but not limited to organic polymer spin-on-polymer dielectric materials and amorphous carbon dielectric materials as are discussed within the Description of the Related Art), as well as oxygen containing plasma etchable semiconductor materials and oxygen containing plasma etchable conductor materials (such as but not limited to doped polyacetylene materials and graphite materials). Such oxygen containing plasma etchable materials may be formed into the oxygen containing plasma etchable layer 12 while employing methods as are conventional in the art of microelectronics fabrication, such methods including but not limited to chemical vapor deposition (CVD) methods, plasma enhanced chemical vapor deposition (PECVD) methods, physical vapor deposition (PVD) sputtering methods and spin-coating methods. Preferably, the blanket oxygen containing plasma etchable layer 12 is formed to a thickness of from about 3000 to about 9000 angstroms upon the substrate 10.

Within the first preferred embodiment of the present invention with respect to the blanket hard mask layer 14, the blanket hard mask layer 14 may be formed of any hard mask material which is substantially impervious to an oxygen containing etching plasma which is employed when etching the blanket oxygen containing plasma etchable layer 12 to form a corresponding pair of patterned oxygen containing plasma etchable layers. Such hard mask materials are typically selected to afford a resistivity or conductivity similar to the resistivity or conductivity of the oxygen containing plasma etchable layer 12, although such is not required within the present invention. Preferably, the blanket hard mask layer 14 is formed to a thickness of from about 1000 to about 5000 angstroms upon the blanket oxygen containing plasma etchable layer 12.

Within the first preferred embodiment of the present invention with respect to the patterned photoresist layers 16a and 16b, the patterned photoresist layers 16a and 16b may be formed employing any of several photoresist materials as are known in the art of microelectronics fabrication, including photoresist materials selected from the general groups of photoresist materials including but not limited to positive photoresist materials and negative photoresist materials. Preferably, the patterned photoresist layers 16a and 16b are each formed to a thickness of from about 4000 to about 8000 angstroms upon the blanket hard mask layer 14.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket hard mask layer 14 has been patterned to form a pair of patterned hard mask layers 14a and 14b, while employing a first etching plasma 18 in conjunction with the patterned photoresist layers 16a and 16b as a first etch mask layer. Within the first preferred embodiment of the present invention, the first etching plasma 18 employs an etchant gas composition appropriate to the hard mask material from which is formed the blanket hard mask layer 14.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the blanket oxygen containing plasma etchable layer 12 has been patterned to form the patterned oxygen containing plasma etchable layers 12a and 12b, while employing a second etching plasma 20 in conjunction with at least the patterned hard mask layers 14a and 14b as a second etch mask layer. Within the first preferred embodiment of the present invention, the second etching plasma 20 employs an etchant gas composition comprising: (1) an oxygen containing etchant gas which upon plasma activation provides an active oxygen containing etching species; and (2) boron trichloride. The oxygen containing etchant gas may be selected from the group of oxygen containing etchant gases included but not limited to oxygen, ozone, nitrous oxide and nitric oxide. Optionally, the etchant gas composition employed within the second etching plasma 20 may also include a chlorine containing etchant gas other than boron trichloride, such chlorine containing etchant gas including as but not limited to chlorine or hydrogen chloride.

Upon forming the microelectronics fabrication whose schematic cross-sectional diagram is illustrated in FIG. 3, there is formed a microelectronics having formed therein a pair of oxygen containing plasma etchable layers which are etched employing at least a hard mask layer as an etch mask layer, where the pair of oxygen containing plasma etchable layers is formed with enhanced linewidth control and uniform sidewall profile due to the presence within an etchant gas composition which is employed for forming the pair of oxygen containing plasma etchable layers from a blanket oxygen containing plasma etchable layer of boron trichloride in addition to an oxygen containing etchant gas which upon plasma activation provides an active oxygen containing etching species.

Although not specifically illustrated within the schematic cross-sectional diagrams of FIG. 2 and FIG. 3, it is preferred within the method of the present invention that the first etching plasma 18 and the second etching plasma 20 are provided within separate reactor chambers within a "cluster" reactor tool, such that there may be avoided adventitious environmental contamination when forming from the microelectronics fabrication whose schematic Cross-Sectional diagram is illustrated in FIG. 1 the microelectronics fabrication whose schematic cross-sectional diagram is illustrated in FIG. 3. Under such circumstances, the patterned photoresist layers 16a and 16b are stripped from the microelectronics fabrication whose schematic cross-sectional diagram is illustrated in FIG. 2 simultaneously with forming from the blanket oxygen containing plasma etchable layer 12 the patterned oxygen containing plasma etchable layers 12a and 12b. Similarly, under such circumstances, it is also desirable that the patterned photoresist layers 16a and 16b are formed of a thickness such that they are completely stripped from the surface of the microelectronics fabrication whose schematic crass-sectional diagram is illustrated in FIG. 2, with minimal over-etching of the patterned oxygen containing plasma etchable layers 12a and 12b, when forming the microelectronics fabrication whose schematic cross-sectional diagram is illustrated in FIG. 3.

Similarly, although also not specifically illustrated within the schematic cross-sectional diagram of FIG. 2 and FIG. 3, it is also feasible within the method of the present invention to strip from the microelectronics fabrication whose schematic cross-sectional diagram is illustrated in FIG. 2 the patterned photoresist layers 16a and 16b prior to etching the blanket oxygen containing plasma etchable layer 12 to form the patterned oxygen containing plasma etchable layers 12a and 12b. Under such circumstance is often possible to obtain additionally enhanced linewidth control and uniform sidewall profile when forming the patterned oxygen containing plasma etchable layers 12a and 12b. While such a stripping of the patterned photoresist layers 16a and 16b would conventionally expose the patterned hard mask layers 14a and 14b to oxygen containing plasma etching and possible erosion, such etching and erosion are similarly also attenuated within the present invention by incorporation within the etching gas composition employed within the second etching plasma 20 of boron trichloride in addition to the oxygen containing etchant gas which upon plasma activation provides the active oxygen containing etching species.

Second Preferred Embodiment

Figure 4A:
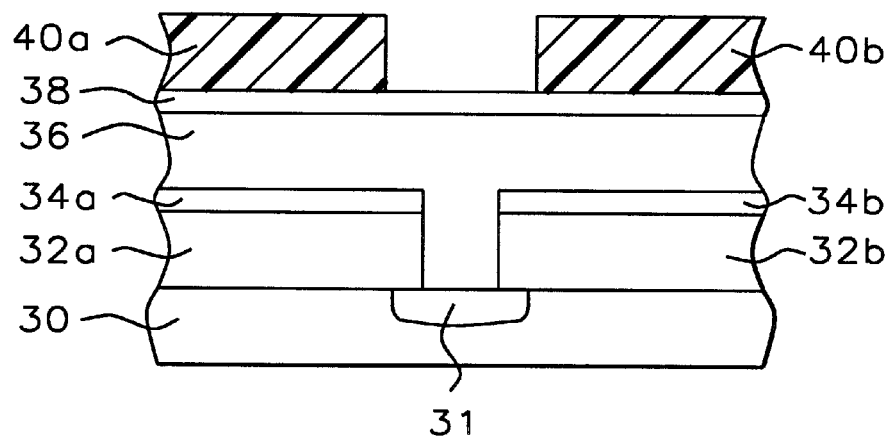
FIG. 4a, FIG. 4b, FIG. 4c, FIG. 5, FIG. 6, FIG. 7 and FIG. 8 show a series of schematic cross-sectional and schematic plan-view diagrams illustrating the results of forming in accord with a series of more specific embodiments of the present invention which comprise a second preferred embodiment of the present invention a contiguous patterned conductor interconnect layer and patterned conductor stud layer into a trench contiguous with a via within a microelectronics fabrication.

Referring now to FIG. 4a to FIG. 8, there is shown a series of schematic cross-sectional and plan-view diagrams illustrating the results of forming within a microelectronics fabrication in accord with a more specific embodiment of the present invention which comprises second preferred embodiment of the present invention a contiguous patterned conductor interconnect layer and patterned conductor stud layer. Shown in FIG. 4a, FIG. 4b and FIG. 4c are three separate microelectronics fabrications within which ultimately may be formed the contiguous patterned conductor interconnect layer and patterned conductor stud layer in accord with the second preferred embodiment of the present invention.

Referring more specifically to FIG. 4a, there is shown a substrate 30 having formed therein a contact region 31, where the substrate 30 has formed thereupon a pair of patterned first oxygen containing plasma etchable dielectric layers 32a and 32b which have formed and aligned thereupon a pair of patterned first hard mask layers 34a and 34b. Within the second preferred embodiment of the present invention, the substrate 30 may be selected from any of several substrates analogously or equivalently with the substrate 10 employed within the first preferred embodiment of the present invention as illustrated within the schematic cross-sectional diagram of FIG. 1. With respect to the contact region 31, within the second preferred embodiment of the present invention, the contact region 31 is typically and preferably either a semiconductor contact region or a conductor contact region within the microelectronics fabrication within which is employed the substrate 30. When the substrate 30 is a semiconductor substrate and the contact region 31 is a semiconductor substrate contact region, as is more preferred within the second preferred embodiment of the present invention, the contact region 31 is typically and preferably employed when forming within the substrate 30 semiconductor integrated circuit devices.

With respect to the patterned first oxygen containing plasma etchable dielectric layers 32a and 32b, the patterned first oxygen containing plasma etchable dielectric layers 32a and 32b may be formed from an oxygen containing plasma etchable dielectric material selected from the group including but not limited to oxygen containing plasma etchable organic polymer spin-on-polymer dielectric materials and oxygen containing plasma etchable amorphous carbon dielectric materials, both of which are typically and preferably low dielectric constant dielectric materials. Preferably, the patterned first oxygen containing plasma etchable dielectric layers 32a and 32b are each formed to a thickness of from about 3000 to about 9000 angstroms upon the substrate 30.

With respect to the patterned first hard mask layers 34a and 34b, although the patterned first hard mask layers 34a and 34b may, similarly with the first preferred embodiment of the present invention, be formed employing any of several hard mask materials as are known in the art of microelectronics fabrication, including but not limited to conductor hard mask materials, semiconductor hard mask materials and dielectric hard mask materials, for the second preferred embodiment of the present invention, the patterned first hard mask layers 34a and 34b are preferably formed of a dielectric hard mask material, preferably selected from the group including but not limited to silicon oxide hard mask materials, silicon nitride hard mask materials and silicon oxynitride hard mask materials. Preferably, the patterned first hard mask layers 32a and 32b are each formed to a thickness of from about 1000 to about 5000 angstroms upon the corresponding patterned first oxygen containing plasma etchable dielectric layers 32a and 32b.

As is understood by a person skilled in the art, the patterned first oxygen containing plasma etchable dielectric layers 32a and 32b, and the patterned first hard mask layers 34a and 34b, may be formed upon the substrate 30 as illustrated within the schematic cross-sectional diagram of FIG. 4a while employing methods and materials analogous or equivalent to the methods and materials employed in forming the patterned hard mask layers 14a and 14b and the patterned oxygen containing plasma etchable layers 12a and 12b within the first preferred embodiment of the present invention as illustrated within the schematic cross-sectional diagram of FIG. 3.

Shown also within FIG. 4a formed upon the patterned first hard mask layers 34a and 34b and contacting the contact region 31 of the substrate 30 is a blanket second oxygen containing plasma etchable dielectric layer 36 having formed thereupon a blanket second hard mask layer 38 in turn having formed thereupon a pair of patterned photoresist layers 40a and 40b.

Within the second preferred embodiment of the present invention, the blanket second oxygen containing plasma etchable dielectric layer 36 is preferably formed employing methods, materials and dimensions analogous or equivalent to the methods, materials and dimensions employed for farming a blanket first oxygen containing plasma etchable dielectric layer from which is formed the patterned first oxygen containing plasma etchable dielectric layers 32a and 32b. Similarly, within the second preferred embodiment of the present invention, the blanket second hard mask layer 38 is preferably formed employing methods, materials and dimensions analogous or equivalent to the methods, materials and dimensions employed for forming a blanket first hard mask layer from which is formed the patterned first hard mask layers 34a and 34b. Finally, within the second preferred embodiment of the present invention, the patterned photoresist layers 40a and 40b are preferably formed employing methods materials and dimensions analogous or equivalent to the methods, materials and dimensions employed for forming the patterned photoresist layers 16a and 16b as employed within the first preferred embodiment of the present invention and illustrated within the schematic cross-sectional diagram Although not specifically illustrated within the schematic cross-sectional diagram of FIG. 4a, the pair of patterned first oxygen containing plasma etchable dielectric layers 32a and 32b and the pair of patterned first hard mask layers 34a and 34b define a via accessing the contact region 31, where the via typically and preferably has a linewidth of from about 0.10 to about 0.30 microns. Similarly, the patterned second photoresist layers 40a and 40b define the location of a trench to be formed through the blanket second hard mask layer 38 and the blanket second oxygen containing plasma etchable dielectric layer 36, where the trench is of greater areal dimension than the via and preferably has contained completely therein the anal dimension of the via.

Figure 4B:
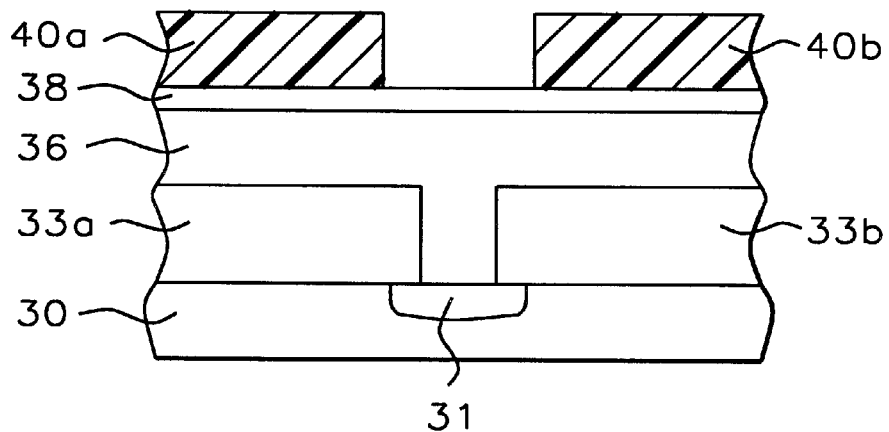

Referring more specifically to FIG. 4b, there is shown a schematic cross-sectional diagram of a microelectronics fabrication otherwise equivalent to the microelectronics fabrication whose schematic cross-sectional diagram is illustrated in FIG. 4a, but wherein instead of the pair of patterned first oxygen containing plasma etchable dielectric layers 32a and 32b having formed and aligned thereupon the pair of patterned first hard mask layers 34a and 34b, there is substituted a pair of patterned first non-oxygen containing plasma etchable dielectric layers 33a and 33b. Typically and preferably, the pair of patterned first non-oxygen containing plasma etchable dielectric layers 33a and 33b is formed of a dielectric material selected from the group including but not limited to silicon oxide dielectric materials, silicon nitride dielectric materials and silicon oxynitride dielectric materials, where each patterned first non-oxygen containing plasma etchable dielectric layer 33a or 33b is formed to a thickness analogous or equivalent to the aggregate thickness of a corresponding patterned first oxygen containing plasma etchable dielectric layer 32a or 32b and a corresponding patterned first hard mask layer 34a or 34b as illustrated in FIG.

Figure 4C:
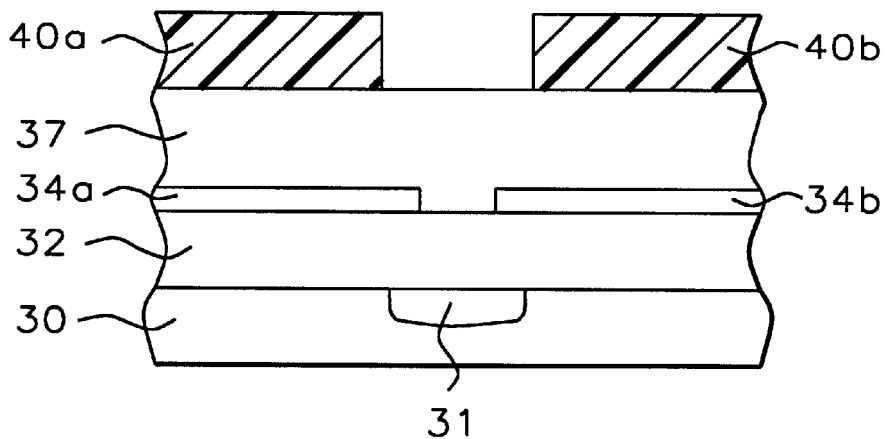

Referring more specifically to FIG. 4c, there is shown a microelectronics fabrication otherwise equivalent to the microelectronics fabrication whose schematic cross-sectional diagram is illustrated in FIG. 4a, but wherein: (1) the patterned first oxygen containing plasma etchable dielectric layers 32a and 32b are replaced with a blanket first oxygen containing plasma etchable dielectric layer 32; and (2) the blanket second oxygen containing plasma etchable dielectric layer 36 and the blanket second hard mask layer 38 are replaced with a blanket second non-oxygen containing plasma etchable dielectric layer 37. Within the microelectronics fabrication of FIG. 4c, the blanket second non-oxygen containing plasma etchable dielectric layer 37 is etchable within a plasma other than a plasma employed for etching the patterned first hard mask layers 34a and 34b, neither of which preceding plasmas is employed for etching the blanket first oxygen containing plasma etchable dielectric layer 32.

While within the second preferred embodiment of the present invention there may be employed either the microelectronics fabrication whose schematic cross-sectional diagram is illustrated within FIG. 4a, the microelectronics fabrication whose schematic cross-sectional diagram is illustrated in FIG. 4b or the microelectronics fabrication whose schematic cross-sectional diagram is illustrated in FIG. 4c, the remainder of the description of the second preferred embodiment of the present invention describes additional processing of the microelectronics fabrication whose schematic cross-sectional diagram of FIG. 4a, in order to provide clarity.

Figure 5:
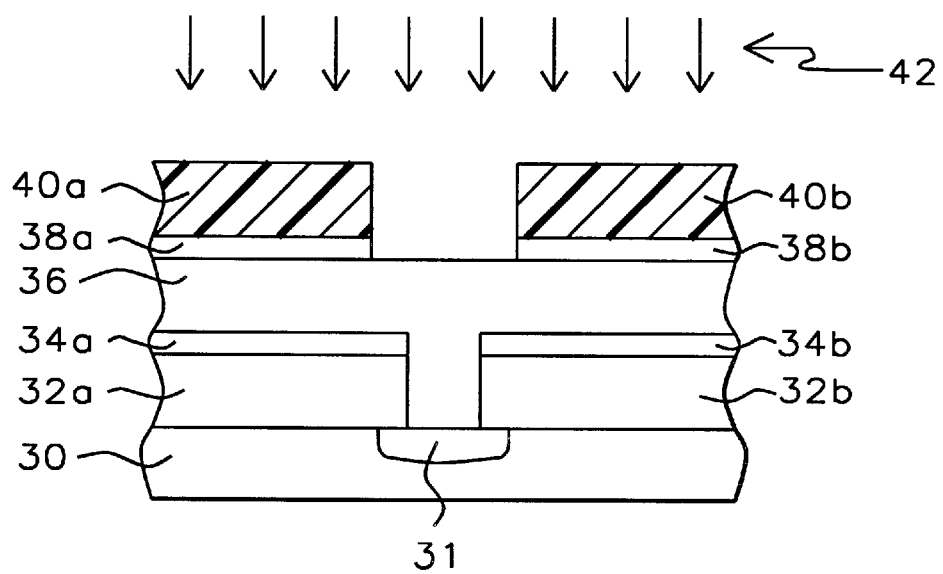

Referring now to FIG. 5, there is shown a schematic cross-sectional diagram illustrating the results of further processing of the microelectronics fabrication whose schematic cross-sectional diagram is illustrated in FIG. 4a. Shown in FIG. 5 is a schematic cross-sectional diagram of a microelectronics fabrication otherwise equivalent to the microelectronics fabrication whose schematic cross-sectional diagram is illustrated in FIG. 4a, but wherein the blanket second hard mask layer 38 has been patterned to form the patterned second hard mask layers 38a and 38b while employing a first etching plasma 42, in conjunction with the patterned photoresist layers 40a and 40b as a first etch mask layer. Within the second preferred embodiment of the present invention when the blanket second hard mask layer 38 is preferably formed of a hard mask material selected from the group of hard mask materials including but not limited to silicon oxide hard mask materials, silicon nitride hard mask materials and silicon oxynitride hard mask materials, the first etching plasma 42 preferably employs an etchant gas composition which upon plasma activation provides an active fluorine containing etchant species. More preferably, the first etching plasma 42 employs an etchant gas composition comprising a fluorocarbon, such as but not limited to a perfluorocarbon or a hydrofluorocarbon, or alternatively sulfur hexafluoride or nitrogen trifluoride, along with an optional sputter gas component such as but not limited to argon or xenon. The first etching plasma 42 may be employed within a magnetically enhanced reactive ion etch (MERIE) method or a high density plasma reactive ion etch (HDP-RIE) method. High density plasma reactive ion etch (HDP-RIE) methods typically employ the sputtering component.

Process conditions and materials employed when the first etching plasma 42 is employed within a magnetically enhanced reactive ion etch (MERIE) method include: (1) a reactor chamber pressure of from about 50 to about 150 mtorr; (2) a source radio frequency power of from about 400 to about 1000 watts at a source radio frequency of 13.56 MHZ; (3) a magnetic bias of up to about 60 gauss; (4) a substrate temperature of from about 10 to about 50 degrees centigrade; (5) a carbon tetra fluoride flow rate of from about 10 to about 50 standard cubic centimeters per minute (scan); (6) a trifluoromethane flow fate of from about 10 to about 50 standard cubic centimeters per minute (scan); and (7) an argon flow rate of from about 50 to about 200 standard cubic centimeters per minute (sccm).

Process conditions and materials employed when the first etching plasma 42 is employed within a high density plasma reactive ion etch (HDP-RIE) method include: (1) a reactor chamber pressure of from about 3 to about 30 mtorr; (2) a source radio frequency power of from about 500 to about 2000 watts at a source radio frequency of 13.56 MHZ; (3) a bias power of from about 50 to about 300 watts; (4) a substrate temperature of from about 10 to about 30 degrees centigrade; (5) a hexafluoroethane flow rate of from about 50 to about 200 standard cubic centimeters per minute (scan); (6) an octafluorocyclobutane flow rate of from about 50 to about 200 standard cubic centimeters per minute (scan); and (7) an argon flow rate of from about 200 to about 500 standard cubic centimeters per minute (sccm).

The first etching plasma is employed for a time period sufficient to completely etch through the blanket second hard mask layer 38 when forming the patterned second hard mask layers 38a and 38b.

Figure 6:
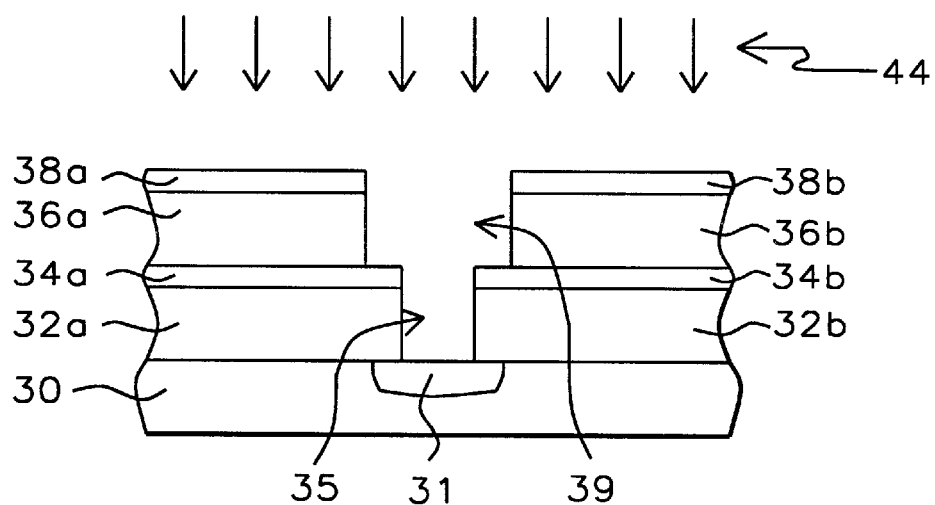

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein there is formed from the blanket second oxygen containing plasma etchable dielectric layer 36 a pair of patterned second oxygen containing plasma etchable dielectric layers 36a and 36b which define a trench 39 contiguous with a via 35 defined by the patterned first oxygen containing plasma etchable dielectric layers 32a and 32b and the patterned first hard mask layers 34a and 34b, by etching while employing a second etching plasma 44, in conjunction with at least the pair of patterned second hard mask layers 38a and 38b and the pair of patterned first hard mask layers as a pair of second etch mask layers.

Within the second preferred embodiment of the present invention, the second etching plasma 44 is formed employing methods and materials analogous or equivalent to the methods and materials employed for forming the second etching plasmas 20 within the first preferred embodiment of the present invention as illustrated within the schematic cross-sectional diagram of FIG. 3. Specifically, the second etching plasma 44 employs an etchant gas composition comprising: (1) an oxygen containing etchant gas which upon plasma activation provides an active oxygen containing etchant species; and (2) boron trichloride, along with an optional chlorine containing etchant gas other than boron trichloride. More preferably, the second etching plasma 44 employs an etchant gas composition comprising oxygen, chlorine and boron trichloride, where the second etching plasma 44 may, similarly with the first preferred embodiment of the present invention, be provided employing plasma methods including but not limited to magnetically enhanced reactive ion etch (MERIE) plasma etch methods and high density plasma reactive ion etch (HDP-RIE) plasma etch methods.

Process conditions and materials employed when the second etching plasma 44 is employed within a magnetically enhanced reactive ion etch (MERIE) plasma etch method include: (1) a reactor chamber pressure of from about 30 to about 150 mtorr; (2) a radio frequency source power of from about 400 to about 1000 warts at a source radio frequency of 13.56 MHZ; (3) a magnetic bias of up to about 60 gauss; (4) a substrate 30 temperature of from about 40 to about 80degrees centigrade; (5) an oxygen flow rate of from about 10 to about 50 standard cubic centimeters per minute (sccm). (6) a chlorine flow rate of from about 10 to about 50 standard cubic centimeters per minute (sccm); and (7) a boron trichloride flow rate of from about 10 to about 50 standard cubic centimeters per minute (sccm).

Process conditions and materials employed when the second etching plasma 44 is employed within a high density plasma reactive ion etch (HDP-RIE) plasma etch method include: (1) a reactor chamber pressure of from about 5 to about 20 mtorr; (2) a source radio frequency power of from about 400 to about 2000 watts a source radio frequency of 13.56 MHZ; (3) a bias power of from about 40 to about 200 watts; (4) a substrate 30 temperature of from about 30 to about 80 degrees centigade; (5) an oxygen flow rate of from about 10 to about 50 standard cubic centimeters per minute (sccm); (6) a chlorine flow rate of from about 10 to about 50 standard cubic centimeters per minute (scan); and (7) a boron trichloride flow rate of from about 10 to about 50 standard cubic centimeters per minute.

As is illustrated within the schematic cross-sectional diagram of FIG. 6, and in accord with the method of the present invention, both the trench 39 and the via 35 are foamed with vertical and uniform sidewalk and with enhanced linewidth control since there is employed when forming both the trench 39 and the via 35 the second plasma etch method 44 which employs an etchant gas composition comprising: (1) an oxygen containing etchant gas which upon plasma activation provides an active oxygen containing etchant species; and (2) boron trichloride.

Subsequent to forming the trench 39 and the via 35 within the microelectronics fabrication whose schematic cross-sectional diagram is illustrated in FIG. 6 while employing the second etching plasma 44, it is preferred within the second preferred embodiment of the present invention to employ an amine stripper solution to remove any residues remaining. Particularly preferred, but not limiting are ethanolamine based stripper solutions such as are commercially available from Ashland Chemical Co. as ACT 690e and 935 stripper solutions and alternatively available as EKC 265 stripper solutions from alternate suppliers. The use of such amine stripper solutions provides optimal contact resistance when subsequently forming within the trench 39 and via 35 a contiguous patterned conductor interconnect layer and patterned conductor stud layer.

Figure 7:
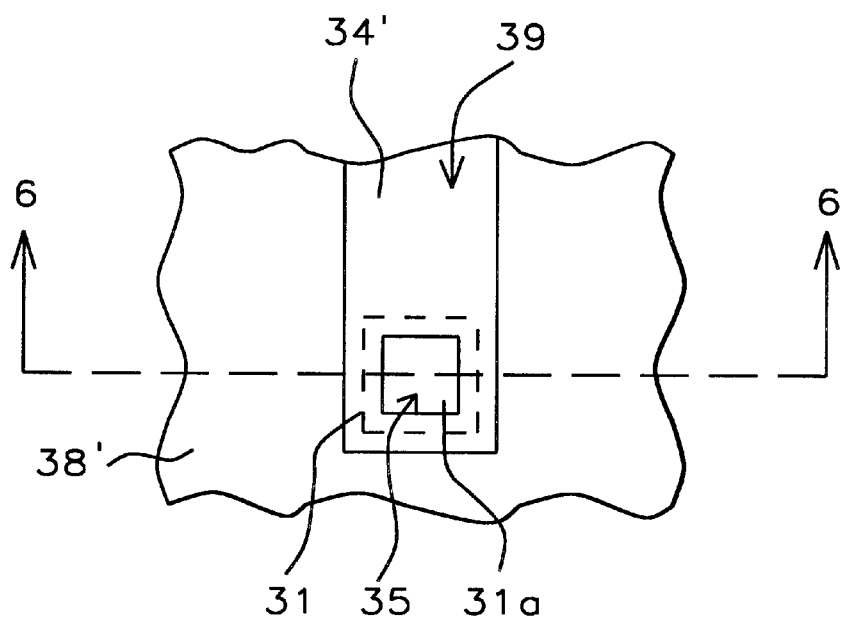

Referring now to FIG. 7, there is shown a schematic plan-view diagram of a microelectronics fabrication corresponding with the microelectronics fabrications whose schematic cross-sectional diagram is illustrated in FIG. 6. Shown in FIG. 7 is the patterned second hard mask layer 38' which defines the trench 39 having as its floor the patterned first hard mask layer 34' which in turn has formed therein the via 35 which accesses an exposed portion 31a of the contact region 31.

Figure 8:
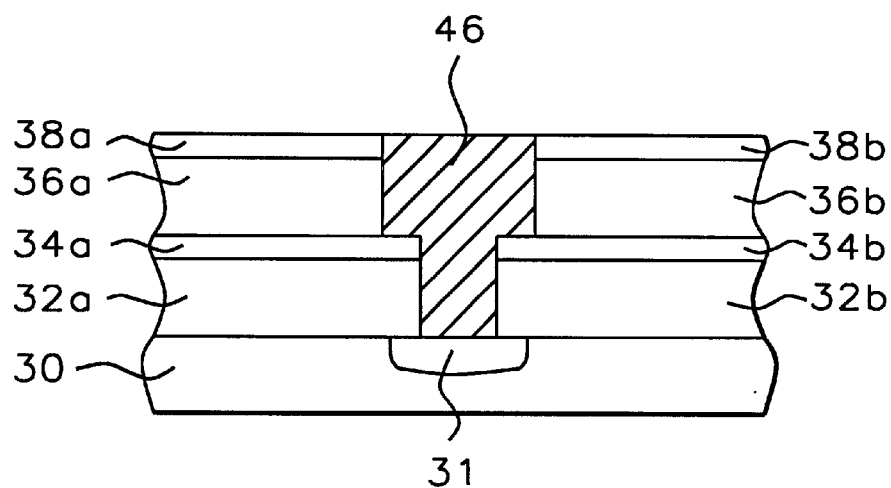

Referring now to FIG. 8, there is shown a schematic cross-sectional diagram illustrating the results of further processing of the microelectronics fabrication whose schematic cross-sectional diagram is illustrated in FIG. 6. Shown in FIG. 8 is a schematic cross-sectional diagram of a microelectronics fabrication otherwise equivalent to the microelectronics fabrication whose schematic cross-sectional diagram is illustrated in FIG. 6, but wherein there is formed into the trench 39 and the via 35 a contiguous patterned conductor interconnect layer and patterned conductor stud layer 46.

To form from the microelectronics fabrication whose schematic cross-sectional diagram is illustrated in FIG. 6 the microelectronics fabrication whose schematic cross-sectional diagram is illustrated in FIG. 8, there is first formed upon the microelectronics fabrication whose schematic cross-sectional diagram is illustrated in FIG. 6 a blanket conductor interconnect and stud layer which fills the trench 39 and via 35 while covering the adjoining portions of the patterned second hard mask layers 38a and 38b. The blanket conductor interconnect layer and stud layer is then planarized employing a chemical mechanical polish (CMP) planarizing method. The blanket conductor interconnect and stud layer may be formed of conductor interconnect and stud materials as are known in the art of microelectronics fabrication, including but not limited to metals, metal alloys, doped polysilicon and polycide (doped polysilicon/metal silicide stack) conductor materials beneath which may optionally be formed barrier material layers. Such metals and metal alloys may include, but are not limited to aluminum, aluminum alloy, copper, copper alloy, tungsten and tungsten alloys.

Although not specifically illustrated within the schematic cross-sectional diagram of FIG. 8, the contiguous patterned conductor interconnect layer and patterned conductor stud layer 46 when formed employing the damascene method into the trench 39 and the via 35 is less susceptible to electrical bridging and leakage to an adjoining patterned conductor interconnect layer and patterned conductor stud layer (which is not shown) since in addition to providing enhanced linewidth control and uniform sidewall profile when forming the patterned second oxygen containing plasma etchable dielectric layers 36a and 36b and the patterned first oxygen containing plasmas etchable dielectric layers 32a and 32b, the use within the second etching plasma 44 of boron trichloride in addition to the oxygen containing etchant gas which upon plasma activation provides an active oxygen containing etchant species also provides for less plasma etch induced surface faceting of the blanket second hard mask layers 38a and 38b, thus allowing for a more complete and efficient chemical mechanical polish (CMP)

planarizing of the blanket conductor interconnect and conductor contact layer when forming the contiguous patterned conductor interconnect layer and patterned conductor stud layer 46 (which also has less susceptibility to dishing due to over polishing).

Upon forming the microelectronics fabrication whose schematic cross-sectional diagram is illustrated within FIG. 8, there is formed a microelectronics fabrication having formed therein a contiguous patterned conductor interconnect layer and patterned conductor stud layer formed with enhanced linewidth control, uniform sidewall profile, attenuated dishing and with attenuated electrical leakage to an adjoining contiguous patterned conductor interconnect layer and patterned conductor stud layer. The method of the present invention realizes the foregoing objects by employing when forming from a blanket oxygen containing plasma etchable dielectric layer having formed thereupon a pair of patterned hard mask layers a pair of patterned oxygen containing plasma etchable dielectric layers while employing an etching plasma employing an etchant gas composition comprising: (1) an oxygen containing etchant gas which upon plasma activation forms an active oxygen containing etchant species; and (2) boron trichloride.

As is understood by a person skilled in the art, the preferred embodiments of the present invention are descriptive of the present invention rather than limiting of the present invention. Revisions and modifications may be made to methods, materials, structures and dimensions through which may be formed microelectronics fabrications in accord with the preferred embodiments and examples of the present invention while still forming microelectronics fabrications in accord with the present invention, as defined by the accompanying claims.

What is claimed is:

1. A method for forming a patterned oxygen containing plasma etchable layer comprising:
    providing a substrate;
    forming upon the substrate a blanket oxygen containing plasma etchable layer;
    forming upon the blanket oxygen containing plasma etchable layer a blanket hard mask layer;
    forming upon the blanket hard mask layer a patterned photoresist layer;
    etching, while employing a first plasma etch method in conjunction with the patterned photoresist layer as a first etch mask layer, the blanket hard mask layer to form a patterned hard mask layer; and
    etching, while employing a second plasma etch method in conjunction with at least the patterned hard mask layer as a second etch mask layer, the blanket oxygen containing plasma etchable layer to form a patterned oxygen containing plasma etchable layer, the second plasma etch method employing a second etchant gas composition comprising:
        an oxygen containing etchant gas which upon plasma activation provides an active oxygen etching species; and
        boron trichloride.

2. The method of claim 1 wherein the boron trichloride within the second etchant gas composition provides enhanced linewidth control and uniform sidewall profile of the patterned oxygen containing plasma etchable layer.

3. The method of claim 1 wherein the boron trichloride within the second etchant gas composition provides attenuated surface etching of the patterned hard mask layer.

4. The method of claim 1 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

5. The method of claim 1 wherein the oxygen containing plasma etchable layer is formed from an oxygen containing plasma etchable material selected from the group consisting of organic polymer spin-on-polymer materials, amorphous carbon materials and graphite carbon materials.

6. The method of claim 1 wherein the oxygen containing etchant gas is selected from the group consisting of oxygen, ozone, nitrous oxide and nitric oxide.

7. The method of claim 1 wherein the second etchant gas composition comprises an oxygen containing etchant gas, boron trichloride and a chlorine containing etchant gas other than boron trichloride.

8. A method for forming a patterned conductor layer comprising:
    providing a substrate;
    forming upon the substrate a blanket oxygen containing plasma etchable dielectric layer;
    forming upon the blanket oxygen containing plasma etchable dielectric layer a blanket hard mask layer;
    forming upon the blanket hard mask layer a patterned photoresist layer;
    etching, while employing a first plasma etch in conjunction with the patterned photoresist layer as a first etch mask layer, the blanket hard mask layer to form a patterned hard mask layer;
    etching, while employing a second plasma etch method in conjunction with at least the patterned hard mask layer as a second etch mask layer, the blanket oxygen containing plasma etchable dielectric layer to form a patterned oxygen containing plasma etchable dielectric layer defining an aperture, the second plasma etch method employing a second etchant gas composition comprising:
        an oxygen containing etchant gas which upon plasma activation provides an active oxygen etching species; and
        boron trichloride; and
    forming into the aperture a patterned conductor layer while employing a damascene method.

9. The method of claim 8 wherein the boron trichloride within the second etchant gas composition provides enhanced linewidth control and uniform sidewall profile of the patterned oxygen containing plasma etchable layer.

10. The method of claim 8 wherein the boron trichloride within the second etchant gas composition provides attenuated surface etching of the patterned hard mask layers.

11. The method of claim 8 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

12. The method of claim 8 wherein the oxygen containing plasma etchable dielectric layer is formed from an oxygen containing plasma etchable dielectric material selected from the group consisting of organic polymer spin-on-polymer low dielectric constant dielectric materials and amorphous carbon low dielectric constant dielectric materials.

13. The method of claim 8 wherein the oxygen containing etchant gas is selected from the group consisting of oxygen, ozone, nitrous oxide and nitric oxide.

14. The method of claim 8 wherein the second etchant gas composition comprises an oxygen containing etchant gas, boron trichloride and a chlorine containing etchant gas other than boron trichloride.

15. The method of claim 8 wherein the damascene method is a dual damascene method and the patterned conductor layer is a contiguous patterned conductor interconnect layer and patterned conductor stud layer.

* * * * *